US008709892B2

(12) United States Patent
Mao et al.

(10) Patent No.: US 8,709,892 B2
(45) Date of Patent: Apr. 29, 2014

(54) NANOPARTICLES IN A FLASH MEMORY USING CHAPERONIN PROTEINS

(75) Inventors: Chuanbin Mao, Austin, TX (US); Shan Tang, Austin, TX (US); Sanjay Banerjee, Austin, TX (US)

(73) Assignee: Darpa, Alexandria, VA (US)

( * ) Notice: Subject to any disclaimer, the term of this patent is extended or adjusted under 35 U.S.C. 154(b) by 1464 days.

(21) Appl. No.: 11/915,039

(22) PCT Filed: May 22, 2006

(86) PCT No.: PCT/US2006/019713

§ 371 (c)(1), (2), (4) Date: Nov. 20, 2007

(87) PCT Pub. No.: WO2006/127589

PCT Pub. Date: Nov. 30, 2006

(65) Prior Publication Data

US 2008/0191265 A1 Aug. 14, 2008

Related U.S. Application Data

(60) Provisional application No. 60/683,609, filed on May 23, 2005.

(51) Int. Cl.
*H01L 21/336* (2006.01)

(52) U.S. Cl.
USPC .......................................... 438/257; 257/E29.3

(58) Field of Classification Search
USPC ............... 257/321, E29.3, E21.422; 438/257, 438/264; 977/773, 943
See application file for complete search history.

(56) References Cited

U.S. PATENT DOCUMENTS

| | | | | |
|---|---|---|---|---|
| 7,041,530 | B2 * | 5/2006 | Nunoshita et al. | 438/99 |
| 2004/0079983 | A1 * | 4/2004 | Chae et al. | 257/310 |
| 2004/0110347 | A1 * | 6/2004 | Yamashita | 438/286 |
| 2004/0256662 | A1 * | 12/2004 | Black et al. | 257/317 |

(Continued)

FOREIGN PATENT DOCUMENTS

| | | |
|---|---|---|
| EP | 1 262 489 | 12/2002 |
| WO | WO 03/080796 A | 10/2003 |

OTHER PUBLICATIONS

European Patent Office, International Search Report; Sep. 28, 2006.

(Continued)

*Primary Examiner* — Kimberly Rizkallah
*Assistant Examiner* — Duy T Nguyen
(74) *Attorney, Agent, or Firm* — Robert A. Voigt, Jr.; Winstead, P.C.

(57) ABSTRACT

A method for fabricating a flash memory device where the flash memory device includes a substantially uniform size and spatial distribution of nanoparticles on a tunnel oxide layer to form a floating gate. The flash memory device may be fabricated by defining active areas in a substrate and forming an oxide layer on the substrate. A self-assembled protein lattice may be formed on top of the oxide layer where the self-assembled protein lattice includes a plurality of molecular chaperones. The cavities of the chaperones may provide confined spaces where nanocrystals can be trapped thereby forming an ordered nanocrystal lattice. A substantially uniform distribution of nanocrystals may be formed on the oxide layer upon removal of the self-assembled protein lattice such as through high temperature annealing.

9 Claims, 4 Drawing Sheets

(56) References Cited

U.S. PATENT DOCUMENTS

| | | | | |
|---|---|---|---|---|
| 2005/0042386 A1* | 2/2005 | Nunoshita et al. | ............ | 427/523 |
| 2005/0130258 A1* | 6/2005 | Trent et al. | .................... | 435/68.1 |
| 2005/0202615 A1* | 9/2005 | Duan et al. | .................... | 438/197 |
| 2006/0070494 A1* | 4/2006 | Yoshii et al. | .................... | 75/365 |

OTHER PUBLICATIONS

European Patent Office; International Preliminary Report of Patentability, Nov. 23, 2007.

* cited by examiner

NANOPARTICLES IN A FLASH MEMORY USING CHAPERONIN PROTEINS

GOVERNMENT SPONSORSHIP

This invention was completed under government sponsorship by the Defense Advanced Research Projects Agency and the Grant Number is MDA972-01-1-0035.

TECHNICAL FIELD

The present invention relates to the field of flash memories, and more particularly to assembling nanoparticles on a tunnel oxide layer in a flash memory using chaperonin proteins to provide a more uniform size and spatial distribution of the nanoparticles on the tunnel oxide layer.

BACKGROUND INFORMATION

With the increasing complexity of electronic systems in the future, there is an urgent demand for high-density, low-cost, low-power and high-speed semiconductor memories, such as "flash memory." Flash memory may refer to rewritable memory chips that hold their content without power. An example of a flash memory used to address the need for high-density, low-cost, low-power and high-speed semiconductor memories is an electrical erasable and programmable read-only memory (EEPROM). However, EEPROMs have large write/erase/read times in comparison to other types of semiconductor memories.

Write/erase/read times in EEPROMs may be improved by using what are known as "quantum dots" or nanocrystals embedded between the control oxide and the tunnel oxide in the flash memory. A quantum dot may refer to a small nanoparticle that contains a few electrons. These embedded quantum dots act as a floating gate and may improve the erase/write/read speed. Further, these embedded quantum dots or nanocrystals may improve the non-volatile charge retention time due to the effects of Coulomb blockade, quantum confinement, and reduction of charge leakage from weak spots in the tunnel oxide. Other areas of improvement include device scaling, operating power and device life time.

There have been several methods used in embedding nanocrystals including aerosol deposition, direct chemical vapor deposition (CVD) growth, and precipitation methods that use ion implantation and the deposition of Si-rich oxide layers. In each of these methods, the nanocrystal size and position distribution cannot be controlled. By not being able to control the size and spatial distribution of the nanocrystals between the control oxide and the tunnel oxide, the device performance, scalability and manufacturability may be limited.

Therefore, there is a need in the art for a more uniform size and spatial distribution of the nanoparticles between the control oxide and the tunnel oxide.

SUMMARY

The problems outlined above may at least in part be solved in some embodiments by using chaperonin proteins as a template to provide a more uniform size and spatial distribution of nanoparticles between the control oxide and the tunnel oxide.

In one embodiment of the present invention, a method for fabricating a flash memory device may comprise a step of defining active areas in a substrate. The method may further comprise forming an oxide layer on the substrate. The method may further comprise forming a protein lattice on top of the oxide layer where the protein lattice comprises a plurality of molecular chaperones. The method may further comprise trapping nanocrystals in the protein lattice. The method may further comprise forming a substantially uniform distribution of nanocrystals upon removal of the protein lattice.

The foregoing has outlined rather generally the features and technical advantages of one or more embodiments of the present invention in order that the detailed description of the invention that follows may be better understood. Additional features and advantages of the invention will be described hereinafter which may form the subject of the claims of the invention.

BRIEF DESCRIPTION OF THE DRAWINGS

A better understanding of the present invention can be obtained when the following detailed description is considered in conjunction with the following drawings, in which.

DETAILED DESCRIPTION

It is noted that, even though the following discusses forming a more uniform size and spatial distribution of nanoparticles on a tunnel oxide layer in connection with fabricating a flash memory device, the principles of the present invention may be applied to semiconductor quantum dot lasers, LEDs, photovoltaic devices and photo detectors. It is further noted that a person of ordinary skill in the art would be capable of applying the principles of the present invention to semiconductor quantum dot lasers, LEDs, photovoltaic devices and photo detectors. It is further noted that embodiments covering semiconductor quantum dot lasers and photo detectors would fall within a scope of the present invention.

In the following description, numerous specific details are set forth to provide a thorough understanding of the present invention. However, it will be apparent to those skilled in the art that the present invention may be practiced without such specific details. In other instances, well-known circuits have been shown in block diagram form in order not to obscure the present invention in unnecessary detail. For the most part, details considering timing considerations and the like have been omitted inasmuch as such details are not necessary to obtain a complete understanding of the present invention and are within the skills of persons of ordinary skill in the relevant art.

Figure 1:
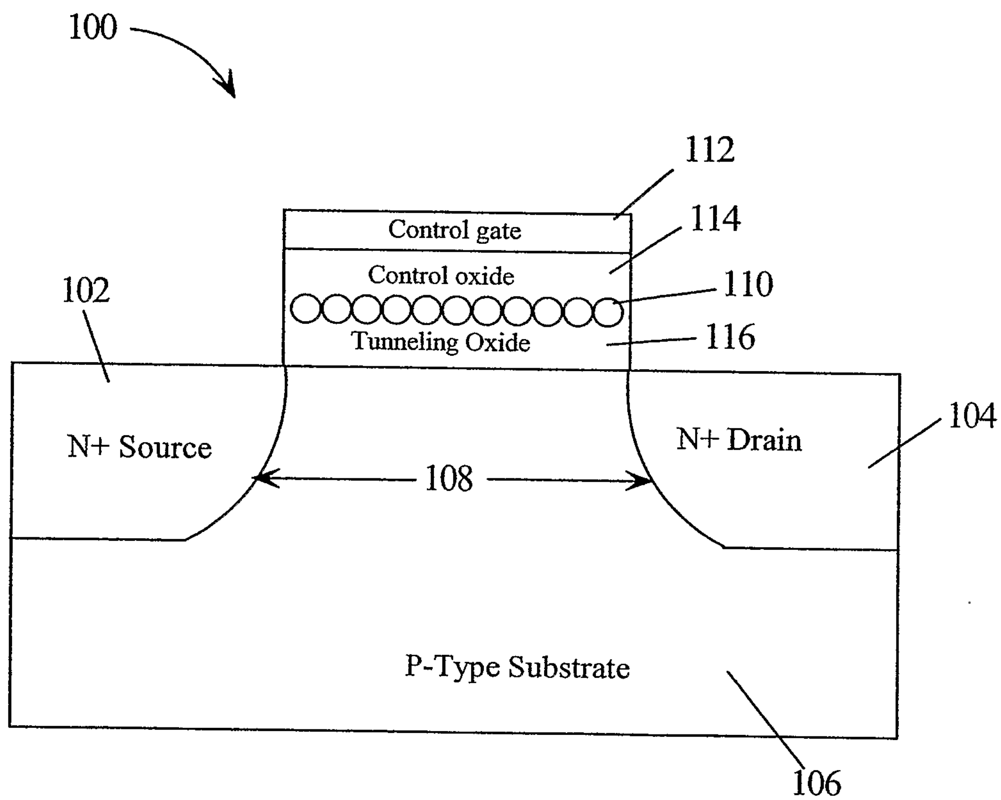
FIG. 1 illustrates a cross-sectional view of a memory cell in accordance with an embodiment of the present invention.

FIG. 1 is an embodiment of the present invention of a cross-sectional view of a typical memory cell 100, such as used in a flash memory. Memory cell 100 includes a region of a source 102 and a region of a drain 104. Source 102 and drain 104 are constructed from an N+ type of high impurity concentration which are formed in a P-type semiconductor substrate 106 of low impurity concentration. Source 102 and drain 104 are separated by a predetermined space of a channel region 108.

Memory cell 100 further includes a floating gate 110 formed by a substantially uniform distribution of nanocrystals as discussed in further detail below. A control gate 112 may be formed by a polysilicon layer. Floating gate 110 is isolated from control gate 112 by an oxide layer ("control oxide layer") 114 and from channel region 108 by an oxide layer ("tunneling oxide layer") 116.

The nanoparticles that form floating gate 110 may be distributed in a substantially uniform manner (size and spatial distribution) on tunneling oxide layer 116 using molecular chaperones. Molecular chaperones are a class of abundant proteins which help and accelerate protein folding in the cell. Chaperonins are one major group of molecular chaperones and have a large multimeric structure consisting of two stacked rings ("doughnuts") of subunits, surrounding a central cavity within which the protein substrate binds. The best studied chaperonin protein is called GroEL. GroEL has a cylindrical cavity with a diameter of 4.6 nm and a wall thickness of 4.5 nm. In the presence of $Mg^{2+}$, $K^+$ and Adenosine TriPhosphate (ATP), the chaperonin will be subjected to conformational change and thus the cavity size can be changed. ATP may refer to a nucleotide that performs many essential roles in the cell. It is the major energy currency of the cell, providing the energy for most of the energy-consuming activities of the cell. Further, the cavity size of the chaperonin may be changed by changes in the pH level. By controlling the cavity size of the chaperoning, the density of the nanocrystals may be controlled. Since the chaperonins have very uniform size and shape, they can be self-assembled and crystallized into a crystalline lattice through non-covalent interactions between the proteins.

Figure 2:
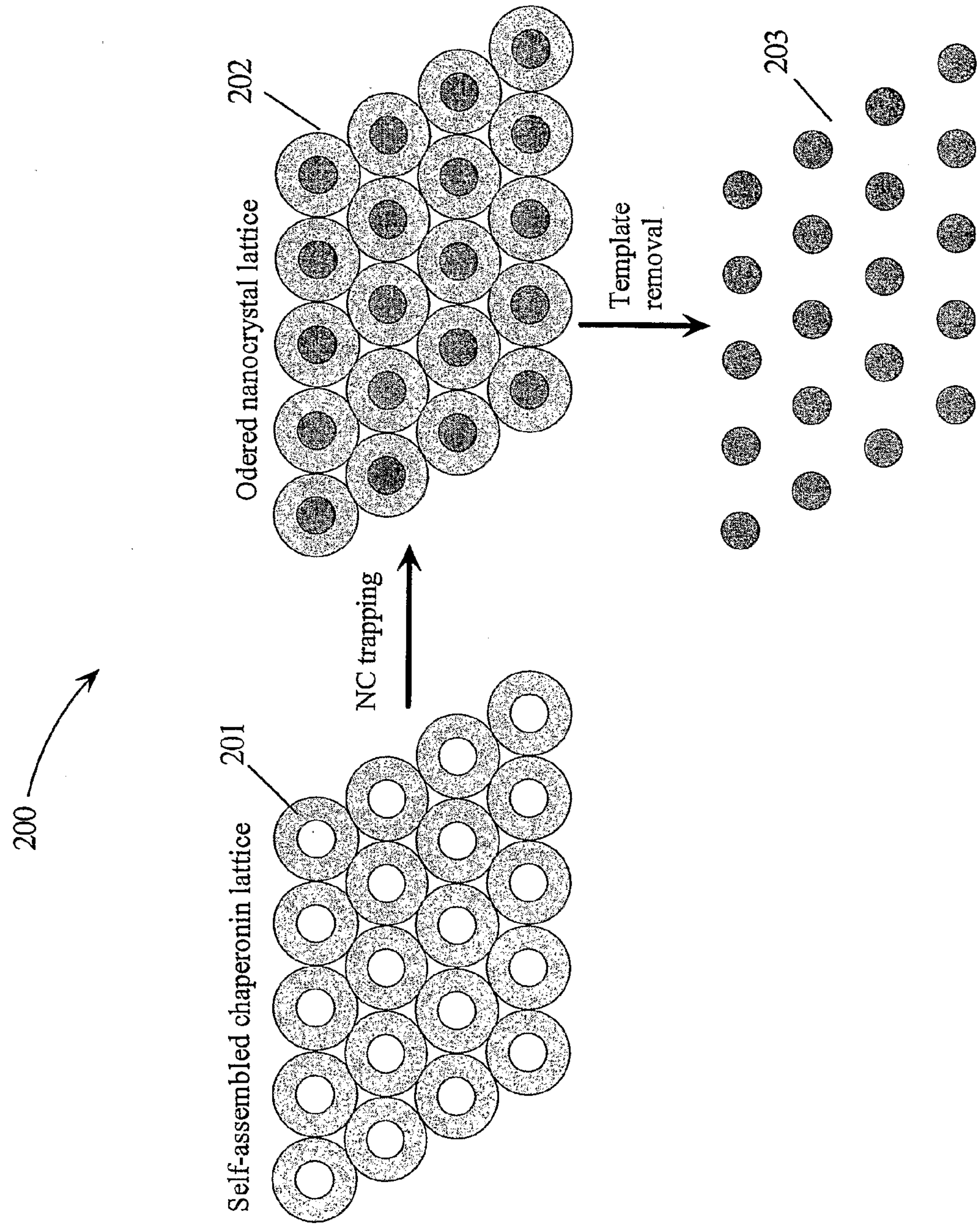
FIG. 2 is a diagram illustrating a method for assembling nanocrystals using a self-assembled chaperonin lattice in accordance with an embodiment of the present invention.

The self-assembled chaperonin array may be used as a scaffold to template the assembly of nanocrystals into an array with controlled architecture on silicon wafers for nanocrystal flash memory fabrication as illustrated in FIG. 2. FIG. 2 is a diagram illustrating a method 200 for assembling the nanocrystals using a self-assembled chaperonin lattice in accordance with an embodiment of the present invention. Referring to FIG. 2, in step 201, a self-assembled chaperonin array on a silicon wafer (not shown) is formed. In the array, the cavities (the holes of the chaperonins) can provide confined spaces where nanocrystals can be trapped thereby forming an ordered nanocrystal lattice in step 202. Here, the chemistry environment of the central cavity (the hole) of each chaperonin is used to trap a nanocrystal. The interior surface of the central cavity is hydrophobic. Therefore, nanocrystals functionalized with hydrophobic molecules will be trapped site-specifically inside the central cavity. Once nanocrystals are trapped by the chaperonin template, the chaperonin template can be simply removed in step 203 through high temperature annealing thereby leaving an array of nanocrystals.

In another embodiment, the protein scaffold may be left in place for functional devices, depending on the electrical conductivity and charge trapping characteristics of the protein. If the proteins are sufficiently insulating, and do not trap many carriers, they may be left in place without impacting flash memory performance.

Figure 3:
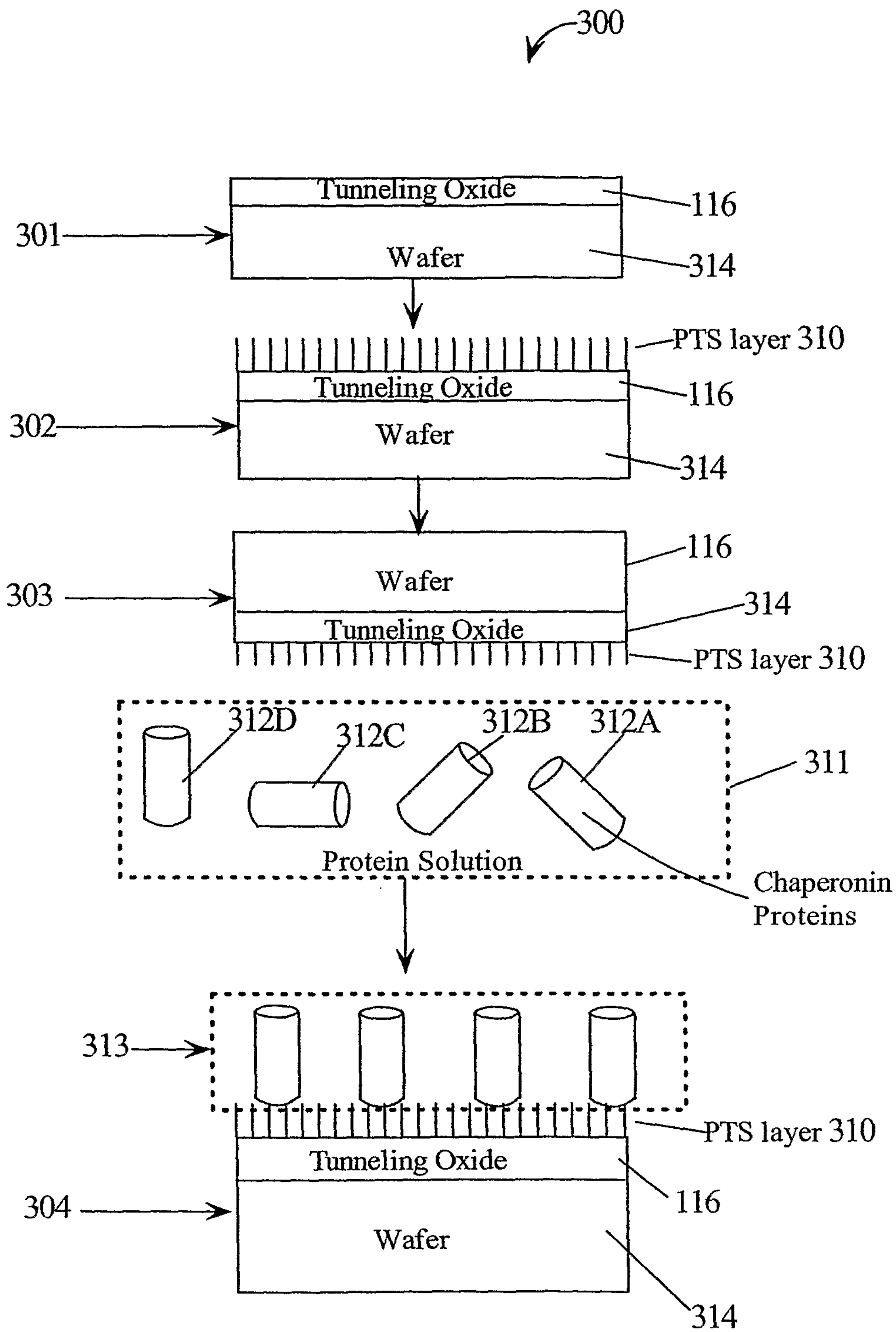
FIG. 3 is a diagram illustrating a process in assembling chaperonin proteins on a tunnel oxide layer in accordance with an embodiment of the present invention.

FIG. 3 is a schematic illustration of a process 300 in assembling chaperonin proteins on a tunnel oxide layer 116 (FIG. 1) in accordance with an embodiment of the present invention. Referring to FIG. 3, in conjunction with FIG. 1, in step 301, tunnel oxide layer 116, e.g., $SiO_2$, is thermally grown on a silicon wafer 314. In step 302, silicon wafer 314 is immersed in a phenyltriethoxysilane (PTS) solution 310. In step 303, silicon wafer 314 may then be floating on a chaperonin protein solution 311 comprised of a plurality of chaperonin proteins 312A-D with oxide side 116 down. Chaperonin proteins 312A-D may collectively or individually be referred to as chaperonin proteins 312, respectively. It is noted that protein solution 311 may include any number of chaperonin proteins 312 and that FIG. 3 is illustrative. In step 304, a protein layer 313 may then be formed on tunneling oxide 116.

A description of a method for fabricating a nanocrystal floating gate flash memory device using the chaperonin proteins to form a substantially uniform size and spatial distribution of nanocrystals on tunneling oxide 116 (FIG. 1), as described above in connection with FIGS. 2-3, is provided below in association with FIG. 4.

Figure 4:
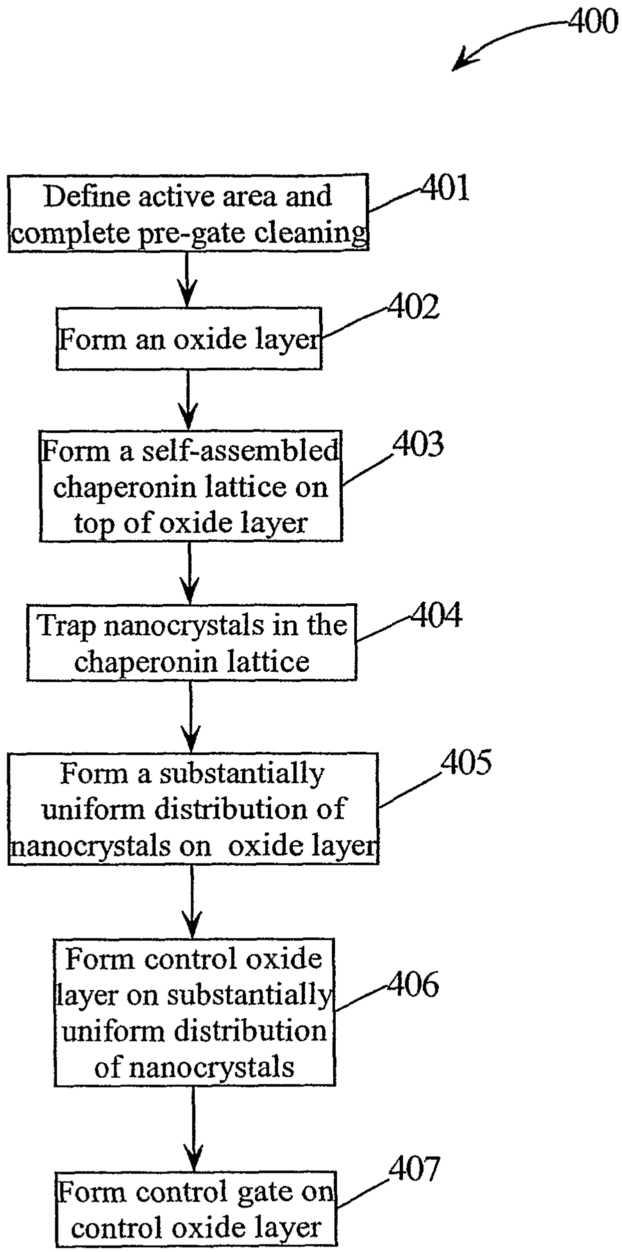
FIG. 4 is a flowchart of a method for fabricating a nanocrystal floating gate flash memory device using chaperonin proteins to form a substantially uniform size and spatial distribution of nanocrystals on a tunnel oxide layer in accordance with an embodiment of the present invention.

FIG. 4 is a flowchart of a method 400 for fabricating a nanocrystal floating gate flash memory device using the chaperonin proteins to form a substantially uniform size and spatial distribution of nanocrystals on tunneling oxide 116 (FIG. 1).

Referring to FIG. 4, in conjunction with FIGS. 1-3, in step 401, the active area, e.g., source 102, drain 104, is defined and pre-gate cleaning is completed. In step 402, silicon wafer 314 is loaded into a thermal oxide furnace or physical vapor deposition (PVD) chamber for deposition of a $SiO_2$ or $HfO_2$ film thereby forming an oxide layer 116. In one embodiment, the thickness of an $HfO_2$ film is typically around 4.8 nm. In one embodiment, the thickness of a $SiO_2$ is typically around 3.6 nm.

In step 403, a self-assembled chaperonin lattice is formed on top of oxide layer 116 with the method described above in association with FIG. 3.

In step 404, nanocrystals are trapped in the chaperonin lattice. In step 405, a substantially uniform distribution of nanocrystals are formed on oxide layer 116 after chaperonin lattice is removed. In one embodiment, the protein is oxidized away after being heated in an oxygen environment.

In step 406, a $SiO_2/HfO_2$ control oxide layer 114 is formed on the substantially uniform distribution of nanocrystals using low pressure CVD (LPCVD) or PVD.

In step 407, a control gate 112 is formed by depositing n+ poly-Si or TaN on control oxide layer 114.

The following steps are the same as standard CMOS fabrication and hence will not be described in detail for the sake of brevity.

It is noted that method 400 may include other and/or additional steps that, for clarity, are not depicted. It is further noted that method 400 may be executed in a different order presented and that the order presented in the discussion of FIG. 4 is illustrative. It is further noted that certain steps in method 400 may be executed in a substantially simultaneous manner.

Although the method and memory device are described in connection with several embodiments, it is not intended to be limited to the specific forms set forth herein, but on the contrary, it is intended to cover such alternatives, modifications and equivalents, as can be reasonably included within the spirit and scope of the invention as defined by the appended claims.

The invention claimed is:

1. A method for fabricating a flash memory device comprising the steps of:

defining active areas in a substrate;

forming an oxide layer on said substrate;

forming a protein lattice on top of said oxide layer, wherein said protein lattice comprises a plurality of molecular chaperones;

trapping nanocrystals in said protein lattice; and forming a substantially uniform distribution of nanocrystals upon removal of said protein lattice.

2. The method as recited in claim 1, wherein said plurality of molecular chaperones comprises chaperonins.

3. The method as recited in claim 1, wherein said nanocrystals are trapped inside a central cavity of a plurality of said plurality of molecular chaperones.

4. The method as recited in claim 3, wherein a size of said central cavity is controlled by an Adenosine TriPhosphate.

5. The method as recited in claim 3, wherein a size of said central cavity is controlled by a pH level.

6. The method as recited in claim 1, wherein said protein lattice is removed by high temperature annealing.

7. The method as recited in claim 1 further comprising the step of:

forming a control oxide layer on said substantially uniform distribution of nanocrystals.

8. The method as recited in claim 7 further comprising the step of:

forming a control gate on said control oxide layer.

9. A method for fabricating a semiconductor device comprising the steps of:

forming an oxide layer on a substrate;

forming a protein lattice on top of said oxide layer;

trapping nanocrystals in said protein lattice; and forming a substantially uniform distribution of nanocrystals upon removal of said protein lattice.

* * * * *